US012588489B2

(12) United States Patent
Hong et al.

(10) Patent No.:  US 12,588,489 B2
(45) Date of Patent:      Mar. 24, 2026

(54) INTEGRATED CIRCUIT DEVICES INCLUDING STACKED ELEMENTS AND METHODS OF FORMING THE SAME

(71) Applicant: Samsung Electronics Co., Ltd., Suwon-si (KR)

(72) Inventors: Byounghak Hong, Albany, NY (US); Jeonghyuk Yim, Halfmoon, NY (US); Inchan Hwang, Schenectady, NY (US); Gilhwan Son, Clifton Park, NY (US); Seungyoung Lee, Clifton Park, NY (US); Saehan Park, Clifton Park, NY (US); Janggeun Lee, Delmar, NY (US); Myunghoon Jung, Clifton Park, NY (US); Seungchan Yun, Waterford, NY (US); Buhyun Ham, Mechanicville, NY (US); Kang-Ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 646 days.

(21) Appl. No.: 17/738,393

(22) Filed: May 6, 2022

(65) Prior Publication Data

US 2023/0275021 A1      Aug. 31, 2023

Related U.S. Application Data

(60) Provisional application No. 63/313,763, filed on Feb. 25, 2022.

(51) Int. Cl.
*H01L 23/528*        (2006.01)
*H01L 21/302*        (2006.01)
*H01L 23/522*        (2006.01)
*H10D 84/01*         (2025.01)
*H10D 84/03*         (2025.01)

(52) U.S. Cl.
CPC ........ *H01L 23/5286* (2013.01); *H01L 21/302* (2013.01); *H01L 23/5226* (2013.01); *H01L 23/5283* (2013.01); *H10D 84/0149* (2025.01); *H10D 84/038* (2025.01)

(58) Field of Classification Search
CPC .............. H01L 23/5286; H01L 21/302; H01L 21/823475; H01L 23/5226; H01L 23/5283
See application file for complete search history.

(56) References Cited

U.S. PATENT DOCUMENTS 8,273,617 B2   9/2012  Thompson et al.
9,685,436 B2   6/2017  Morrow et al.
(Continued)

OTHER PUBLICATIONS

Extended European Search Report, in corresponding EP Application No. 23157586.1, dated Nov. 30, 2023, 16 pages.
(Continued)

*Primary Examiner* — Jay C Kim
*Assistant Examiner* — Woo K Lee
(74) *Attorney, Agent, or Firm* — Myers Bigel, P.A.

(57) ABSTRACT

Integrated circuit devices may include a transistor, a passive device, a substrate extending between the transistor and the passive device and a power rail. The passive device may be spaced apart from the substrate. Each of the passive device and the power rail may have a first surface facing the substrate, and the first surface of the passive device is closer than the first surface of the power rail to the substrate.

14 Claims, 12 Drawing Sheets

(56) References Cited

U.S. PATENT DOCUMENTS

| | | | |
|---|---|---|---|
| 10,217,667 B2 | 2/2019 | Or-Bach et al. | |
| 10,325,821 B1 | 6/2019 | Hook et al. | |
| 10,559,594 B2 | 2/2020 | Tarakji et al. | |
| 11,201,148 B2 | 12/2021 | Liebmann et al. | |
| 2013/0175542 A1 | 7/2013 | Briere et al. | |
| 2020/0105891 A1 | 4/2020 | Lilak et al. | |
| 2020/0212038 A1 | 7/2020 | Rachmady et al. | |
| 2020/0381430 A1 | 12/2020 | Liebmann et al. | |
| 2021/0224457 A1 | 7/2021 | Guo et al. | |
| 2021/0366846 A1* | 11/2021 | Hung | H10D 89/711 |
| 2021/0407942 A1* | 12/2021 | Yu | H01L 24/19 |

OTHER PUBLICATIONS

Lee et al. "Monolithic 3D 6T-SRAM Based on Newly Designed Gate and Source/Drain Bottom Contact Schemes" IEEE Access, 9:138192-138199 (Oct. 2021).
Lu et al. "A Novel Three-Dimensional 6T-SRAM Cell Featuring Vertical Transistors and 24F2 Layout Area" 2021 7th International Conference on Applied System Innovation (ICASI), pp. 88-90 (Sep. 2021).
Salahuddin et al. "SRAM With Buried Power Distribution to Improve Write Margin and Performance in Advanced Technology Nodes" IEEE Electron Device Letters, 40(8):1261-1264 (Aug. 2019).
Sisto et al. "IR-Drop Analysis of Hybrid Bonded 3D-ICs with Backside Power Delivery and μ- & n-TSVs" 2021 IEEE International Interconnect Technology Conference (IITC), pp. 1-3 (Jul. 2021).
Weis et al. "Stacked 3-Dimensional 6T SRAM Cell with Independent Double Gate Transistors" 2009 IEEE International Conference on IC Design and Technology, pp. 169-172 (May 2009).

* cited by examiner

Region 1

Providing a first structure and a second structure — 610

Attaching the first structure to the second structure — 620

Forming a power rail — 630

Forming a power delivery network structure — 640

INTEGRATED CIRCUIT DEVICES INCLUDING STACKED ELEMENTS AND METHODS OF FORMING THE SAME

CROSS-REFERENCE TO RELATED APPLICATION

This application claims priority to U.S. Provisional Application Ser. No. 63/313,763, entitled HYBRID MULTI-STACKED 3D DEVICES, filed in the USPTO on Feb. 25, 2022, the disclosure of which is hereby incorporated by reference herein in its entirety.

FIELD

The present disclosure generally relates to the field of electronics and, more particularly, to integrated circuit devices including stacked elements.

BACKGROUND

Various structures of an integrated circuit device and methods of forming the same have been proposed to increase the integration density thereof by simplifying the middle-of-line (MOL) portion or the back-end-of-line (BEOL) portion of device fabrication. For example, a bonding process in which two separate substrates including elements (e.g., a transistor, a diode or a resistor) are attached to each other has been proposed.

SUMMARY

According to some embodiments of the present invention, integrated circuit devices may include a transistor, a passive device, a substrate extending between the transistor and the passive device and a power rail. The passive device may be spaced apart from the substrate. Each of the passive device and the power rail may have a first surface facing the substrate, and the first surface of the passive device is closer than the first surface of the power rail to the substrate.

According to some embodiments of the present invention, integrated circuit devices may include a transistor comprising a source/drain region, a passive device, a first substrate extending between the transistor and the passive device, a second substrate that is spaced apart from the first substrate in a first direction and first and second bonding pads between the first and second substrates. The passive device may include a portion in the second substrate. The first bonding pad may be electrically connected to the source/drain region of the transistor, and the second bonding pad may be electrically connected to the portion of the passive device.

According to some embodiments of the present invention, methods of forming an integrated circuit devices may include providing a first structure and a second structure. The first structure may include a transistor, a first bonding pad, a first substrate extending between the transistor and the first bonding pad, and the second structure may include a second substrate and a second bonding pad. The methods may also include attaching the first structure to the second structure. After attaching the first structure to the second structure, the first bonding pad may contact the second bonding pad. Further, the methods may include forming a portion of a passive device in the second substrate before or after attaching the first structure to the second structure.

DETAILED DESCRIPTION

According to some embodiments of the present invention, an integrated circuit device may be formed by a bonding process and may include stacked elements (e.g., a transistor, a diode or a resistor). The integrated circuit device may be a single integrated circuit device (e.g., a single chip or a single package) in which all stacked elements are connected through conductive elements (e.g., a wire, a contact plug or a via) provided in the integrated circuit device. In some embodiments, the integrated circuit device may include a first structure and a second structure attached to each other through a bonding process. The first structure may include a first substrate and a monolithic stacked transistor structure formed on the first substrate, and the second structure may include a second substrate and various passive devices formed on the second substrate.

In some embodiments, passive devices of the integrated circuit device may be formed on the second substrate of the second structure. Accordingly, the back-end-of-line (BEOL) portion of a fabrication process for the first structure may be simplified, and the second substrate may have a thickness sufficient to form various doped regions of passive devices therein, as the thickness of the second substrate can be provided regardless of a thickness of the first substrate. In some embodiments, the first structure may not include a passive device of the integrated circuit device.

Figure 1:
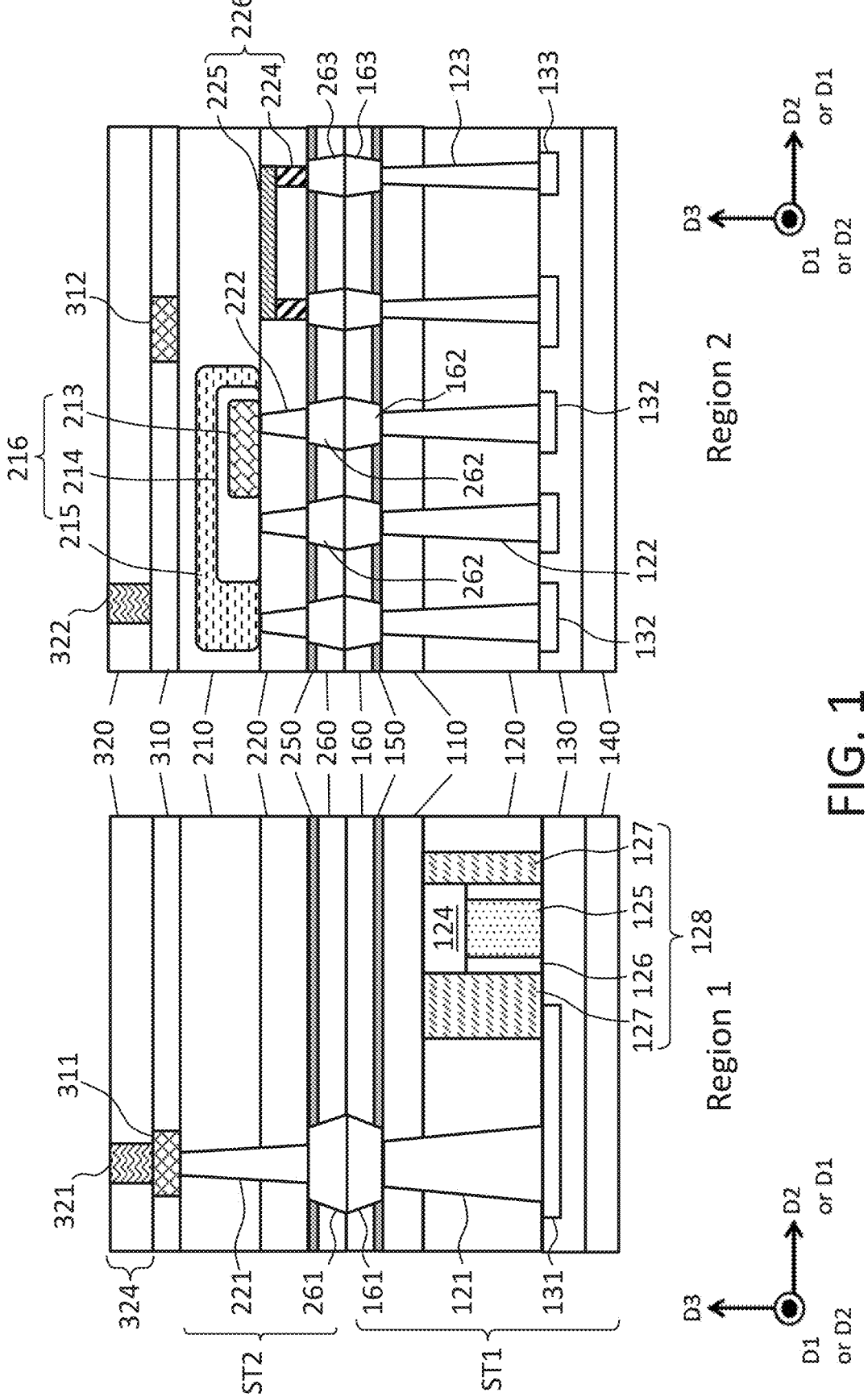
FIG. 1 illustrates cross-sectional views of an integrated circuit device according to some embodiments of the present invention.

FIG. 1 illustrates cross-sectional views of an integrated circuit device according to some embodiments of the present invention. The integrated circuit device may include a Region 1 and a Region 2. In some embodiments, the Region 1 and the Region 2 may be spaced apart from each other in a horizontal direction (e.g., a first direction D1 and a second direction D2). The Region 1 may include various standard cells (e.g., logic cells). The standard cells may include, for example, an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop. The Region 2 may include passive devices such as a resistor, a diode, a bipolar junction transistor, or an electrostatic discharge (ESD) protection circuit.

The Region 1 of the integrated circuit device may include a first portion of a first structure ST1 and a first portion of a second structure ST2. The Region 2 of the integrated circuit device may include a second portion of the first structure ST1 and a second portion of the second structure ST2. The first structure ST1 and the second structure ST2 may be stacked in a vertical direction (e.g., a third direction D3).

The first structure ST1 may include a first substrate 110. The horizontal direction may be parallel to one of opposing surfaces (e.g., a first surface S1 and a second surface S2 in FIG. 8) of the first substrate 110. The vertical direction may be perpendicular to one of those opposing surfaces of the first substrate 110. The second structure ST2 may include a second substrate 210. The first substrate 110 and the second substrate 210 may extend parallel to each other. Each of the first substrate 110 and the second substrate 210 may include one or more semiconductor materials, for example, Si, Ge, SiGe, GaP, GaAs, SiC, SiGeC and/or InP. In some embodiments, each of the first substrate 110 and the second substrate 210 may be a bulk substrate (e.g., a bulk silicon substrate) or a semiconductor on insulator (SOI) substrate. For example, each of the first substrate 110 and the second substrate 210 may be a silicon wafer.

The first structure ST1 may also include a transistor 128 (e.g., a transistor of a logic cell) in the Region 1. The transistor 128 may include an active region 124, a gate structure 125, gate spacers 126 on opposing sides of the gate structure 125, respectively, and source/drain regions 127 adjacent to the opposing sides of the gate structure 125, respectively. The active region 124 may contact the first substrate 110 as illustrated in FIG. 1, or the active region 124 may be a portion of the first substrate 110 defined by an isolation pattern (e.g., a field insulator). In some embodiments, the transistor 128 may be a vertical field effect transistor (VFET) that includes source/drain regions spaced apart from each other in the vertical direction, and one of the source/drain regions may be formed in the first substrate 110. Although FIG. 1 illustrates the transistor 128 having a particular configuration, it should be noted that the transistor 128 may be any one of various types of transistors.

The gate structure 125 may include a gate electrode on the active region 124 and a gate insulator extending between the active region 124 and the gate electrode. For example, the gate electrode may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer), and the gate insulator may include a silicon oxide layer and/or a high-k material layer. The high-k material layer may include, for example, hafnium silicate, zirconium silicate, hafnium dioxide and/or zirconium dioxide.

The gate spacers 126 may include an insulating material (e.g., silicon oxide, silicon nitride, silicon oxynitride, silicon carbide and/or a low-k material). The low k material may include, for example, fluorine-doped silicon dioxide, organosilicate glass, carbon-doped oxide, porous silicon dioxide porous organosilicate glass, spin-on organic polymeric dielectric, or spin-on silicon based polymeric dielectric. The source/drain regions 127 may include, for example, a semiconductor material (e.g., Si or SiGe) and/or impurities (e.g., boron, aluminum, gallium, indium, phosphorus, arsenic, antimony, bismuth and/or lithium).

A first insulating layer 120 may be provided on the first substrate 110, and the transistor 128 may be provided in the first insulating layer 120. First, second and third contact plugs 121, 122 and 123 may also be provided in the first insulating layer 120. In some embodiments, each of the first, second and third contact plugs 121, 122 and 123 may extend through the first substrate 110 and the first insulating layer 120.

A second insulating layer 130 may be provided on the first insulating layer 120, and first, second and third wires 131, 132 and 133 may be provided in the second insulating layer 130. The first, second and third wires 131, 132 and 133 may be electrically connected to the first, second and third contact plugs 121, 122 and 123, respectively. In some embodiments, the first, second and third wires 131, 132 and 133 may contact the first, second and third contact plugs 121, 122 and 123, respectively. The first wire 131 may electrically connect the source/drain region 127 to the first contact plug 121.

A back-end metal structure 140 may be provided on the second insulating layer 130. The back-end metal structure 140 may include metal vias and metal lines formed by a BEOL process. Some of the metal lines of the back-end metal structure 140 may be spaced apart from each other in the vertical direction and may be electrically connected to each other through vias. Although not illustrated, various elements (e.g., the gate electrode 125 and the first wire 131) may be electrically connected to at least one of the metal lines of the back-end metal structure 140. The metal vias and the metal lines of the back-end metal structure 140 may include, for example, ruthenium (Ru), cobalt (Co) and/or tungsten (W).

The first structure ST1 may further include a first bonding insulator 160 extending on the first substrate 110 and a first etch stop layer 150 extending between the first substrate 110 and the first bonding insulator 160. In some embodiments, the first etch stop layer 150 may contact the first substrate 110 and/or the first bonding insulator 160. For example, opposing surfaces of the first etch stop layer 150 may contact the first substrate 110 and the first bonding insulator 160, respectively, as illustrated in FIG. 1.

Further, the first structure ST1 may include a first bonding pad 161 in the Region 1 and second and third bonding pads 162 and 163 in the Region 2. Each of the first, second, and third bonding pads 161, 162 and 163 may extend through the first bonding insulator 160 and the first etch stop layer 150. The first, second and third bonding pads 161, 162 and 163 may be electrically connected to the first, second and third contact plugs 121, 122 and 123, respectively. In some embodiments, the first, second and third bonding pads 161, 162 and 163 may contact the first, second and third contact plugs 121, 122 and 123, respectively. In some embodiments, a width of each of the first, second and third bonding pads 161, 162 and 163 in the horizontal direction may increase as a distance from the first substrate 110 increases, as illustrated in FIG. 1.

The second structure ST2 may also include a passive device 216 including doped regions provided in the second substrate 210. In some embodiments, the passive device 216 may be a bipolar junction transistor including three doped regions (i.e., first, second and third doped regions 213, 214 and 215) as illustrated in FIG. 1. The first and third doped regions 213 and 215 may have a first conductivity type (e.g., P-type or N-type), and the second doped region 214 may have a second conductivity type that is opposite the first conductivity type. In some embodiments, the first and third doped regions 213 and 215 may be P-type regions, and the second doped region 214 may be an N-type region. In some embodiments, the passive device 216 may be a diode including only two doped regions that have opposite conductivity types.

The second structure ST2 may also include a third insulating layer 220, a second etch stop layer 250 and a second bonding insulator 260 stacked on the second substrate 210. The second etch stop layer 250 may extend between the second bonding insulator 260 and the third insulating layer 220. In some embodiments, opposing surfaces of the second etch stop layer 250 may contact the second bonding insulator 260 and the third insulating layer 220, respectively, as illustrated in FIG. 1.

A resistor structure 226 may be provided in the third insulating layer 220 of the Region 2. The resistor structure 226 may include a resistor 225 and resistor contacts 224 that are spaced apart from each other in the horizontal direction. The resistor 225 may include a semiconductor material and/or metal. The resistor 225 may include a material the same as or different from the resistor contacts 224. For example, the resistor 225 and the resistor contacts 224 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer). In some embodiments, the resistor 225 may have a thickness in the vertical direction in a range of from about 1 nanometer (nm) to about 15 nm. For example, the thickness of the resistor 225 in the vertical direction may be in a range of from about 5 nm to about 10 nm.

The resistor 225 may be provided in the third insulating layer 220, as illustrated in FIG. 1, or may be provided in the second substrate 210. In some embodiments, the resistor 225 may include impurities (e.g., boron, aluminum, gallium, indium, phosphorus, arsenic, antimony, bismuth and/or lithium). The resistor contacts 224 may be provided in the third insulating layer 220, as illustrated in FIG. 1, or may be provided in the second substrate 210.

Additionally, fourth and fifth contact plugs 221 and 222 may be provided in the third insulating layer 220, and fourth, fifth and sixth bonding pads 261, 262 and 263 may be provided in the second etch stop layer 250 and the second bonding insulator 260. The fourth and fifth contact plugs 221 and 222 may extend through the third insulating layer 220 and the second substrate 210 and may be electrically connected to the fourth and fifth bonding pads 261 and 262, respectively. In some embodiments, the fourth and fifth contact plugs 221 and 222 may contact the fourth and fifth bonding pads 261 and 262, respectively. The resistor contacts 224 may be electrically connected to the sixth bonding pads 263, respectively. In some embodiments, the resistor contacts 224 may contact the sixth bonding pads 263, respectively.

In some embodiments, a width of each of the fourth, fifth and sixth bonding pads 261, 262 and 263 may increase as a distance from the second substrate 210 increases, as illustrated in FIG. 1. The first, second and third bonding pads 161, 162 and 163 may contact the fourth, fifth and sixth bonding pads 261, 262 and 263, respectively. The first bonding pad 161 and the fourth bonding pad 261 may be collectively referred to as a first merged bonding pad, a width of which in the horizontal direction may increase and then decrease as a distance from the first substrate 110 increases, as illustrated in FIG. 1. The second bonding pad 162 and the fifth bonding pad 262 may be collectively referred to as a second merged bonding pad, a width of which in the horizontal direction may increase and then decrease as a distance from the first substrate 110 increases. The third bonding pad 163 and the sixth bonding pad 263 may be collectively referred to as a third merged bonding pad, a width of which in the horizontal direction may increase and then decrease as a distance from the first substrate 110 increases.

Further, the integrated circuit device may include first and second power rails 311 and 312 that are provided on a surface (e.g., a fourth surface S4 in FIG. 11) of the second substrate 210. The first and second power rails 311 and 312 may be provided in a fourth insulating layer 310. In some embodiments, the first and second power rails 311 and 312 and the fourth insulating layer 310 may contact the second substrate 210. Each of the first and second power rails 311 and 312 may extend along one of standard cell boundaries. In some embodiments, one of the first and second power rails 311 and 312 may be electrically connected to multiple cells. For example, the first power rail 311 may be electrically connected to source/drain regions that are included in multiple cells, respectively. Each of the first and second power rails 311 and 312 may be electrically connected to a first power having a first voltage (e.g., a drain voltage) or a second power having a second voltage (e.g., a source voltage).

A power delivery network (PDN) structure 324 may be provided on the first and second power rails 311 and 312. The first and second power rails 311 and 312 may be provided between the second substrate 210 and the PDN structure 324 as illustrated in FIG. 1. The PDN structure 324 may include a fifth insulating layer 320 and first and second power wires 321 and 322 that are provided in the fifth insulating layer 320. The first power wire 321 may be electrically connected to the first power rail 311. In some embodiments, the first power wire 321 may contact the first power rail 311.

Each of the first and second etch stop layers 150 and 250 may include, for example, a silicon nitride layer and/or silicon oxynitride layer. The first bonding insulator 160 may include a material different from the first etch stop layer 150 such that the first bonding insulator 160 may have an etch selectivity with respect to the first etch stop layer 150. The second bonding insulator 260 may include a material different from the second etch stop layer 250 such that the second bonding insulator 260 may have an etch selectivity with respect to the second etch stop layer 250. Each of the first and second bonding insulators 160 and 260 may include, for example, a silicon oxide layer.

Each of the first to fifth contact plugs 121, 122, 123, 221 and 222, each of the first to sixth bonding pads 161, 162, 163, 261, 262 and 263, each of the first and second power rails 311 and 312, and each of the first and second power wires 321 and 322 may be a conductor and may include a conductive material (e.g., Ru, Co and/or W).

Each of the first, second, third, fourth and fifth insulating layers 120, 130, 220, 310 and 320 may include an insulating material (e.g., silicon oxide, silicon oxynitride, silicon carbide and/or a low-k material).

Figure 2:
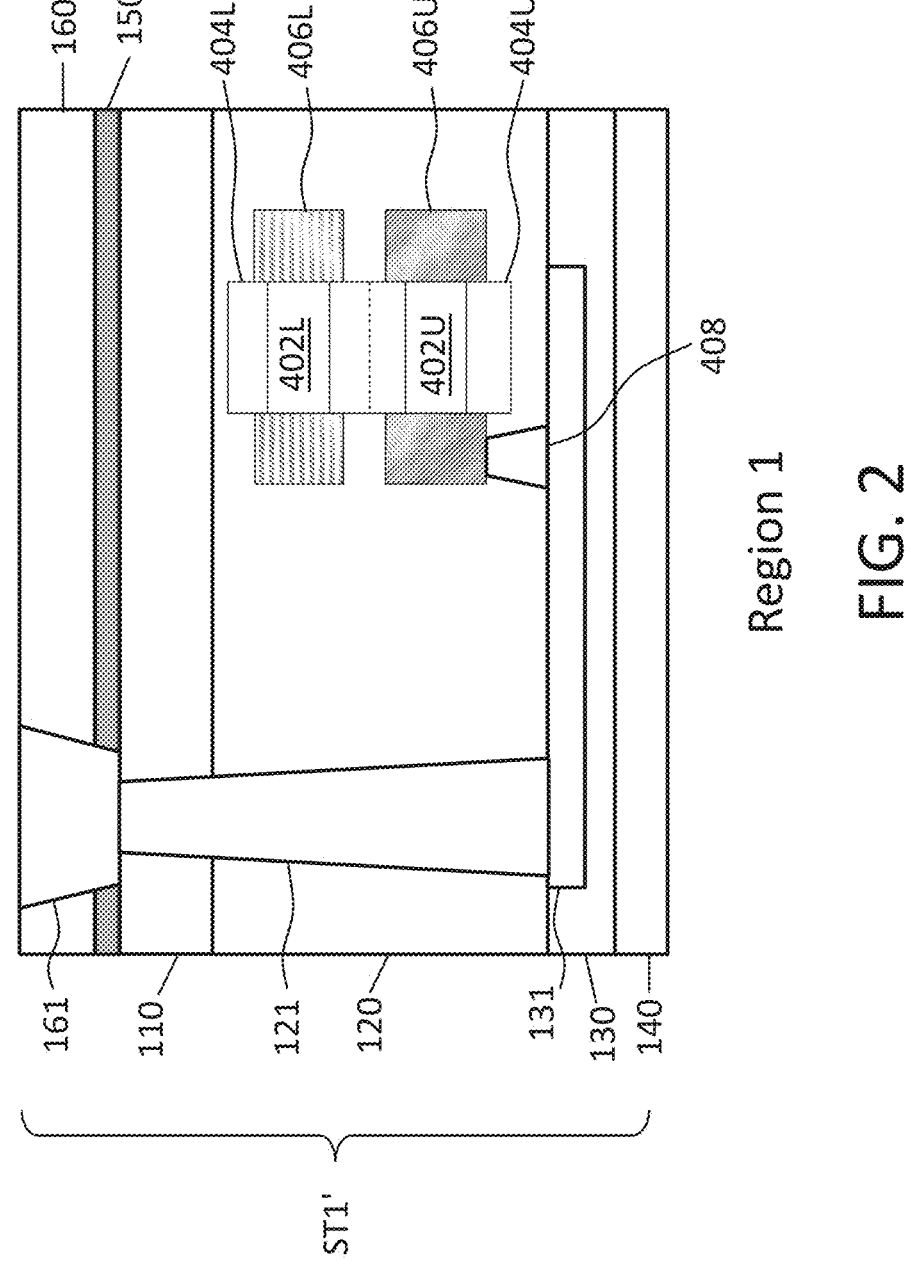
FIG. 2 is a cross-sectional view of a first structure in a Region 1 of an integrated circuit device according to some embodiments of the present invention.

FIG. 2 is a cross-sectional view of a first structure ST1' in a Region 1 of an integrated circuit device according to some embodiments of the present invention. The first structure ST1' may be similar to the first structure ST1 illustrated in FIG. 1, with a primary difference being that the first structure ST1' includes a stacked transistor structure.

Referring to FIG. 2, the stacked transistor structure may include an upper transistor and a lower transistor that is provided between the first substrate 110 and the upper transistor. The upper transistor may include an upper active region 402U, an upper gate electrode 404U, and upper source/drain regions 406U. The upper source/drain regions 406U may contact opposing sides of the upper active region 402U, respectively. The lower transistor may include a lower active region 402L, a lower gate electrode 404L and lower source/drain regions 406L. The lower source/drain regions 406L may contact opposing sides of the lower active region 402L, respectively. Although FIG. 2 illustrates that the upper gate electrode 404U and the lower gate electrode 404L contact each other, in some embodiments, the upper gate electrode 404U and the lower gate electrode 404L may be separated from each other by a gate isolation layer that is provided between the upper gate electrode 404U and the lower gate electrode 404L.

The integrated circuit device may also include a source/drain contact 408 electrically connecting the upper source/drain region 406U to the first wire 131. In some embodiments, the source/drain contact 408 may contact the upper source/drain region 406U and/or the first wire 131. In some embodiments, the source/drain contact 408 may electrically connect the lower source/drain region 406L, instead of the upper source/drain region 406U, to the first wire 131. In some embodiments, the upper transistor and the lower transistor may have different conductivity types. For example, the upper transistor may be a P-type transistor, and the lower transistor may be an N-type transistor.

Figure 3:
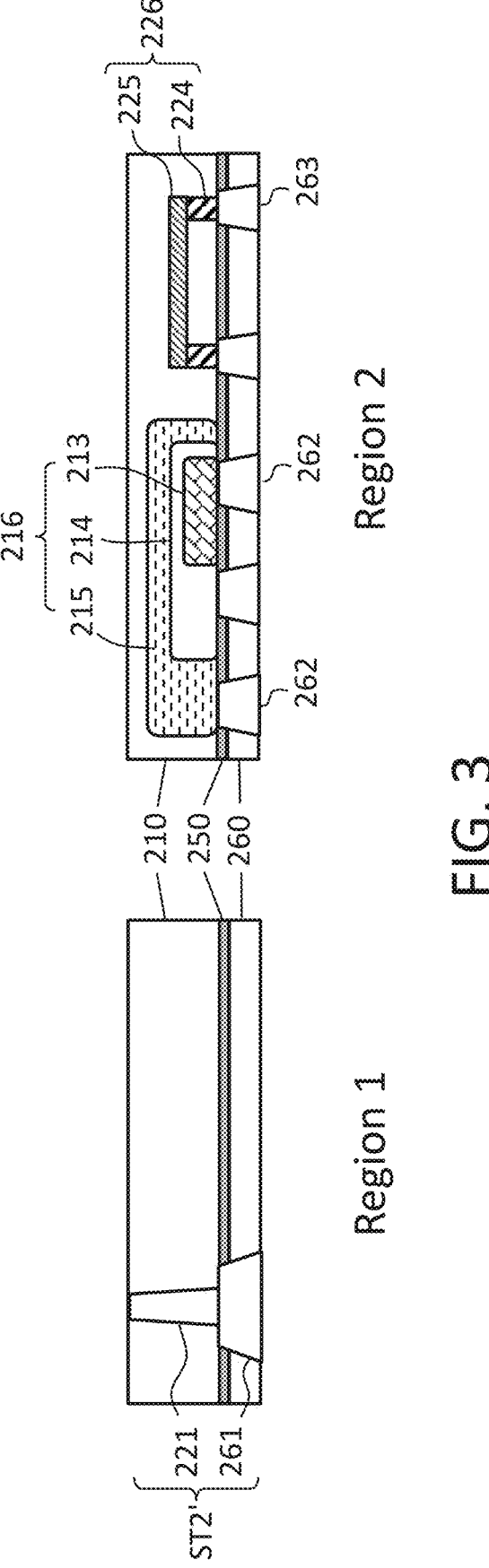
FIG. 3 is a cross-sectional view of a second structure of an integrated circuit device according to some embodiments of the present invention.

FIG. 3 is a cross-sectional view of a second structure ST2' of an integrated circuit device according to some embodiments of the present invention. The second structure ST2' may be similar to the second structure ST2 illustrated in FIG. 1, with a primary difference being that the second structure ST2' does not include the third insulating layer 220. In some embodiments, the passive device 216 may contact the second etch stop layer 250, and the resistor structure 226 may be provided in the second substrate 210.

Figure 4:
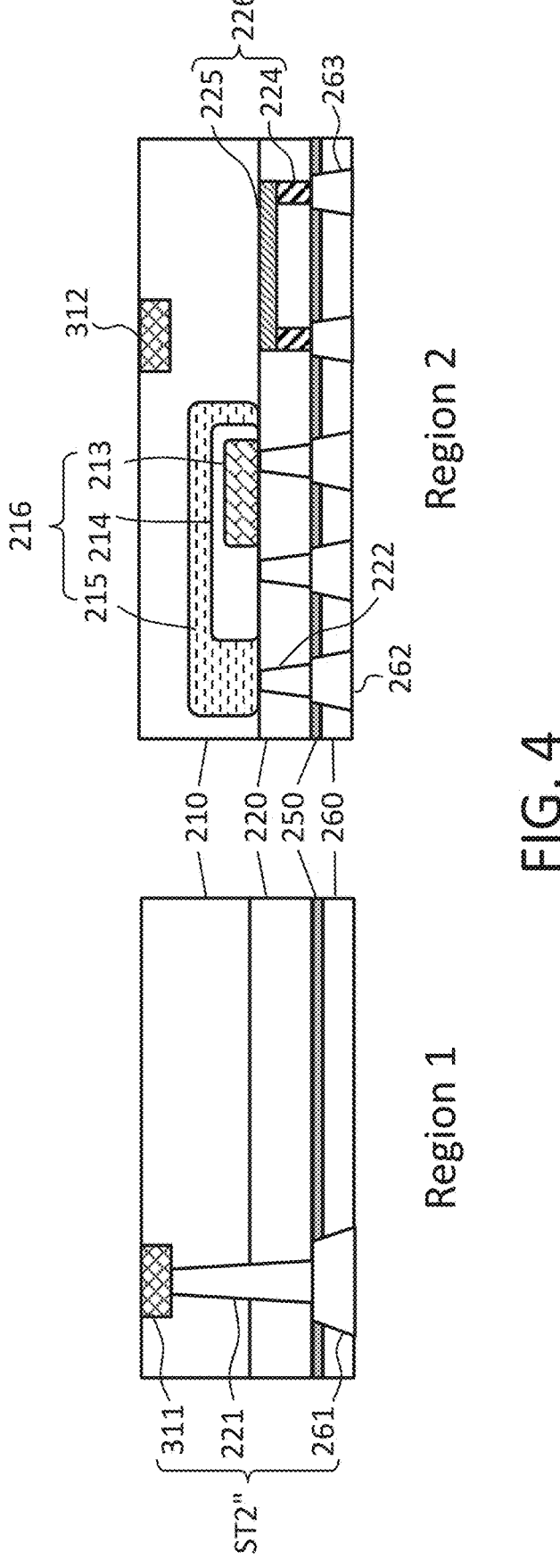
FIG. 4 is a cross-sectional view of a second structure of an integrated circuit device according to some embodiments of the present invention.

FIG. 4 is a cross-sectional view of a second structure ST2" of an integrated circuit device according to some embodiments of the present invention. The second structure ST2" may be similar to the second structure ST2 in FIG. 1, with a primary difference being that the first and second power rails 311 and 312 are provided in the second substrate 210. In some embodiments, surfaces of the first and second power rails 311 and 312 may be coplanar with a surface (e.g., the fourth surface S4 in FIG. 11) of the second substrate 210. In some embodiments, the first and second power rails 311 and 312 may be formed by forming first and second trenches in the second substrate 210 by removing portions of the second substrate 210 and then forming the first and second power rails 311 and 312 in the first and second trenches, respectively. For example, the first and second trenches may be formed in the second substrate 210 by performing an etch process on the surface (e.g., the fourth surface S4 in FIG. 11) of the second substrate 210.

Figure 5:
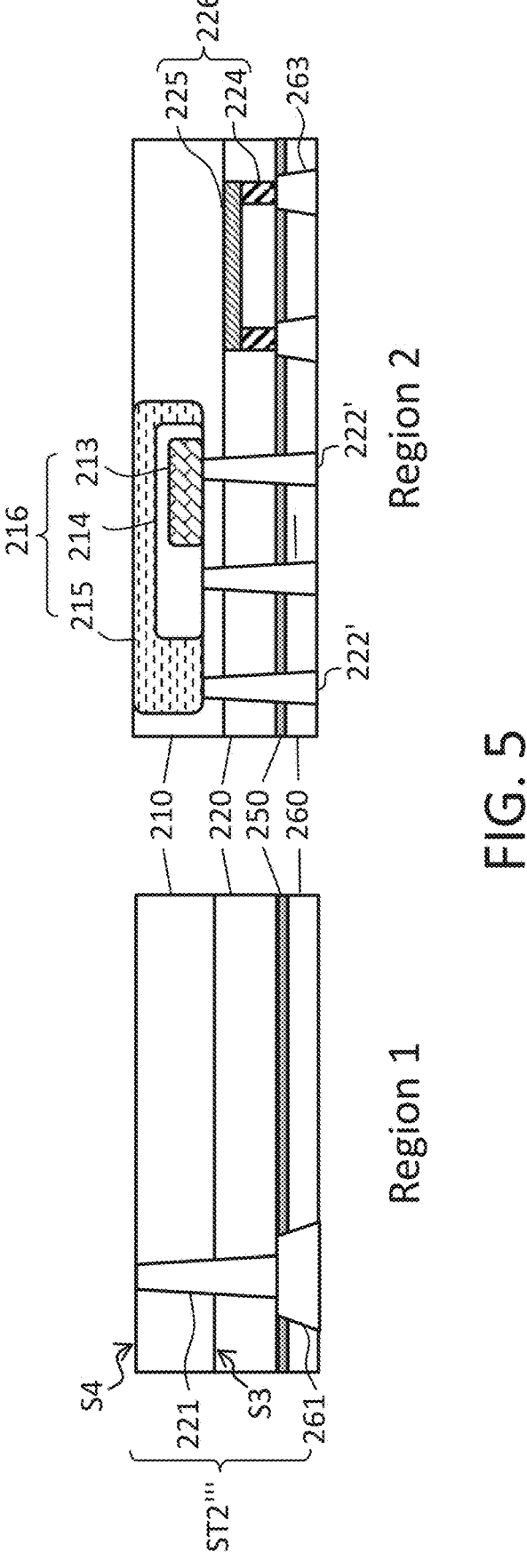
FIG. 5 is a cross-sectional view of a second structure of an integrated circuit device according to some embodiments of the present invention.

FIG. 5 is a cross-sectional view of a second structure ST2''' of an integrated circuit device according to some embodiments of the present invention. The second structure ST2''' may be similar to the second structure ST2 in FIG. 1, with primary differences being that the passive device 216 is closer to a fourth surface S4 than a third surface S3 of the second substrate 210, and portions of the fifth contact plug 222' may be provided in the second substrate 210.

Figure 6:
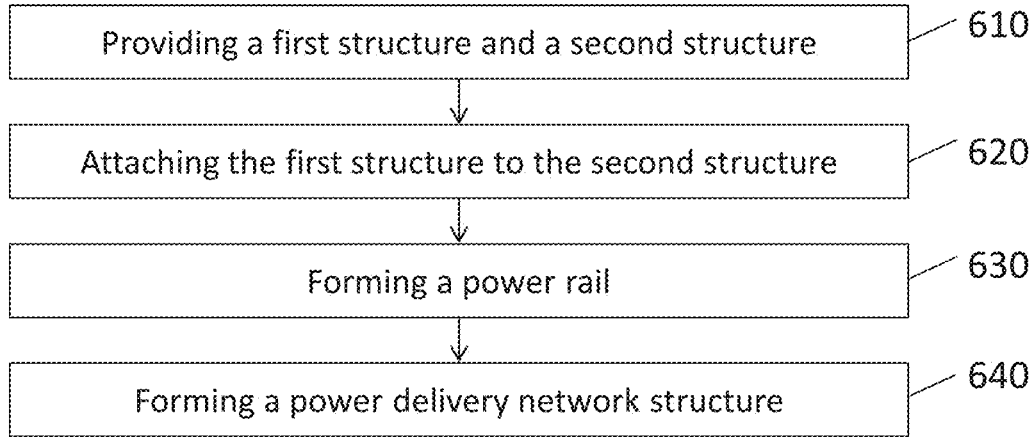
FIG. 6 is a flow chart of methods of forming an integrated circuit device according to some embodiments of the present invention.

FIG. 6 is a flow chart of methods of forming an integrated circuit device according to some embodiments of the present invention, and FIGS. 7 through 12 are cross-sectional views illustrating methods of forming an integrated circuit device according to some embodiments of the present invention.

Figure 7:
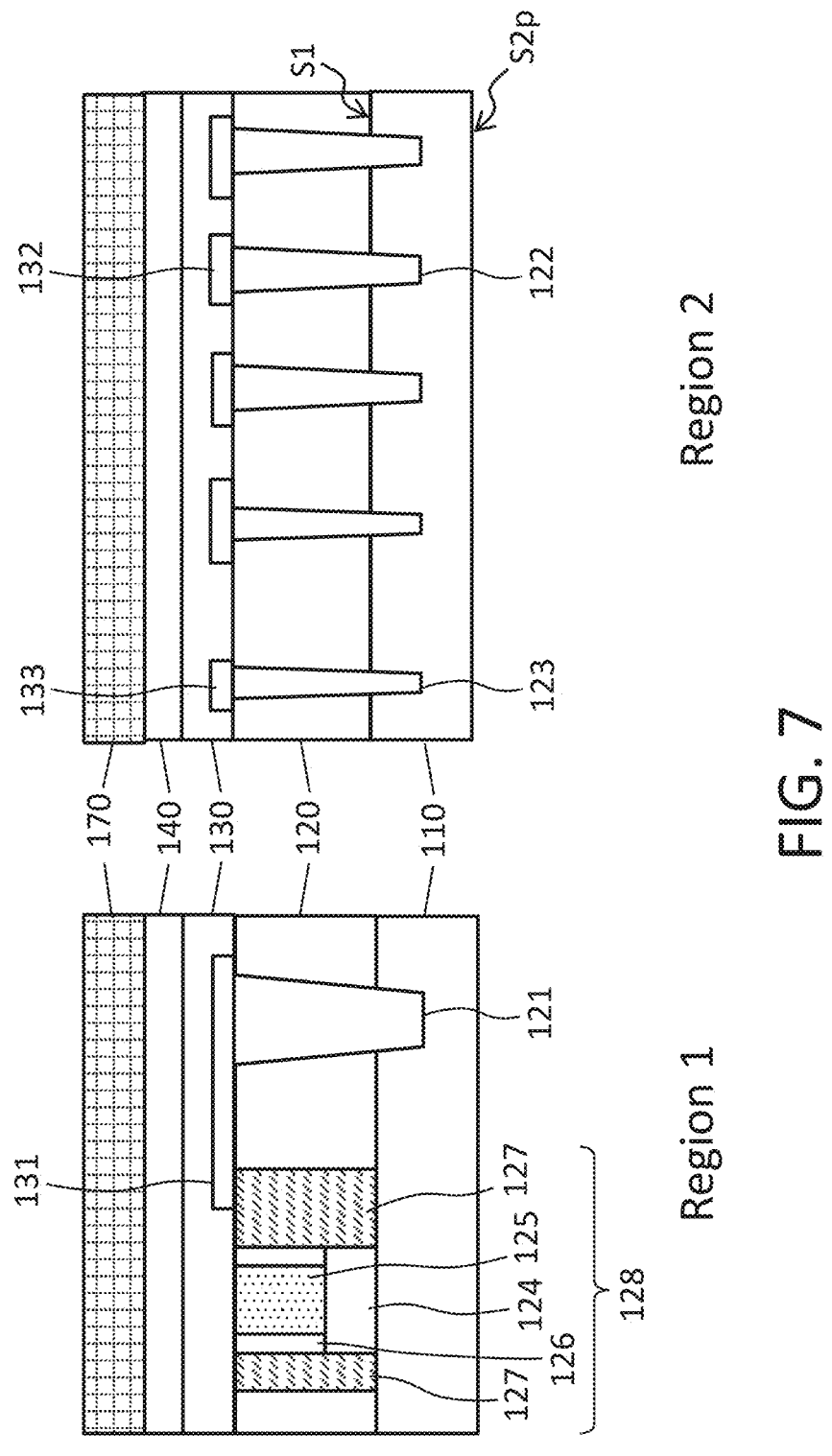
FIGS. 7 through 12 are cross-sectional views illustrating methods of forming an integrated circuit device according to some embodiments of the present invention.

Referring to FIGS. 6 through 9, the methods may include providing a first structure ST1 (Block 610). Referring to FIG. 7, a transistor 128 may be formed on a first surface S1 of a first substrate 110 and a first insulating layer 120 may be formed around the transistor 128. The first insulating layer 120 may contact the first surface S1 of the first substrate 110. The first substrate 110 may include a preliminary second surface S2p opposite the first surface S1. First, second and third contact plugs 121, 122 and 123 may be formed in the first insulating layer 120. The first surface S1 may be referred to as an upper surface or a front side, and the preliminary second surface S2p may be referred to as a preliminary lower surface or a preliminary back side. In some embodiments, the first, second and third contact plugs 121, 122 and 123 may extend through the first insulating layer 120 and may protrude into the first substrate 110.

First, second and third wires 131, 132 and 133 may be formed on the first insulating layer 120, and a second insulating layer 130 may be formed around the first, second and third wires 131, 132 and 133. A back-end metal structure 140 may be formed on the second insulating layer 130 and then a carrier wafer 170 may be attached to the back-end metal structure 140. The carrier wafer 170 is used as a mechanical and handling support. For example, the carrier wafer 170 may be made of a semiconductor material (e.g., silicon), glass and/or quartz.

Figure 8:
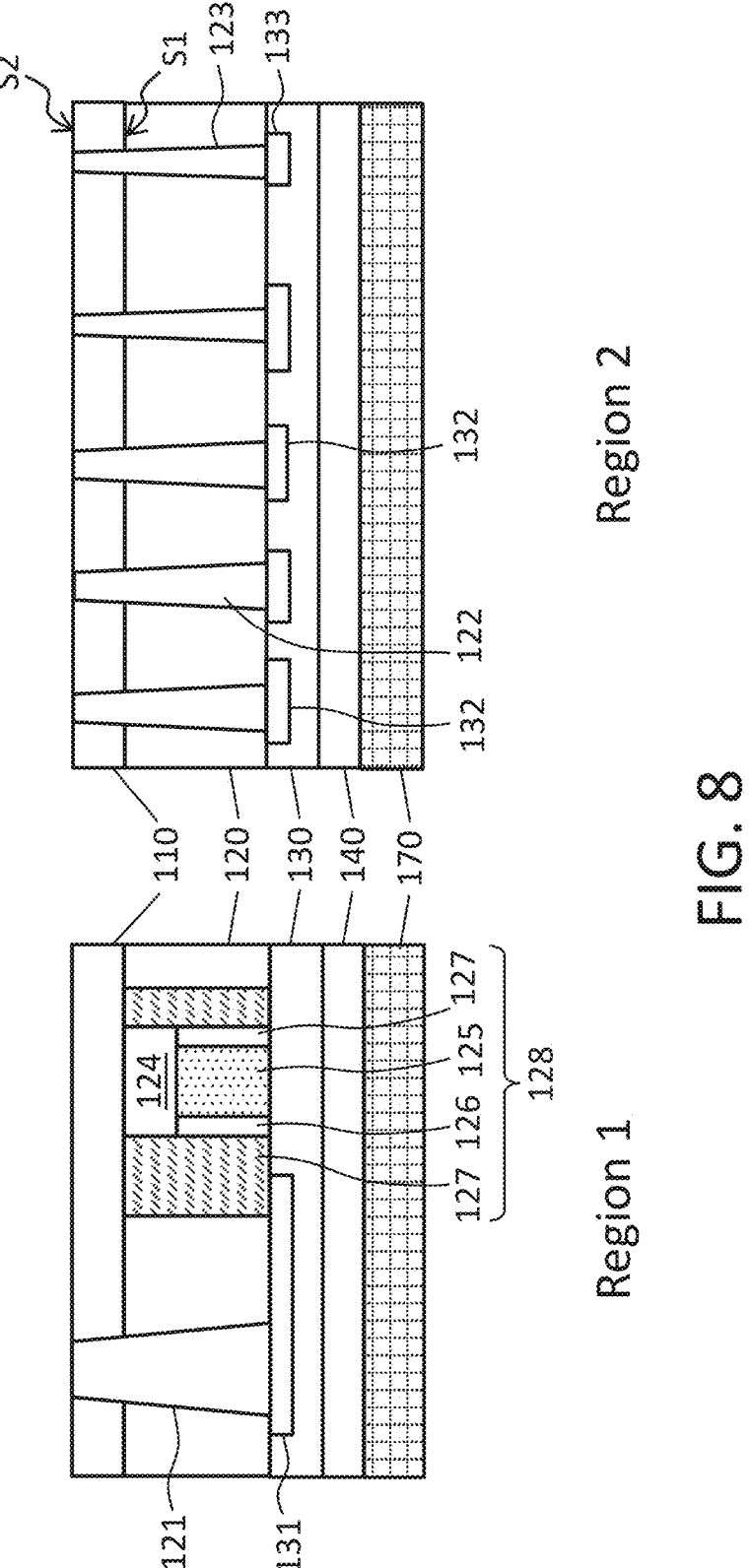

Referring to FIG. 8, the structure shown in FIG. 7 may be turned around (e.g., flipped), and a process (e.g., a grinding process, a wet etch process and/or a dry etch process) that removes a lower portion of the first substrate 110 may be performed on the preliminary second surface S2p until the first, second and third contact plugs 121, 122 and 123 are exposed. Surfaces of the first, second and third contact plugs 121, 122 and 123 may be coplanar with a second surface S2 of the first substrate 110 after removing the lower portion of the first substrate 110. A distance between the first surface S1 and the second surface S2 of the first substrate 110 (i.e., a thickness of the first substrate 110 after removing the lower portion thereof) may be in a range of 50 nm to 100 nm. The second surface S2 may be referred to as a lower surface or a back side.

Figure 9:
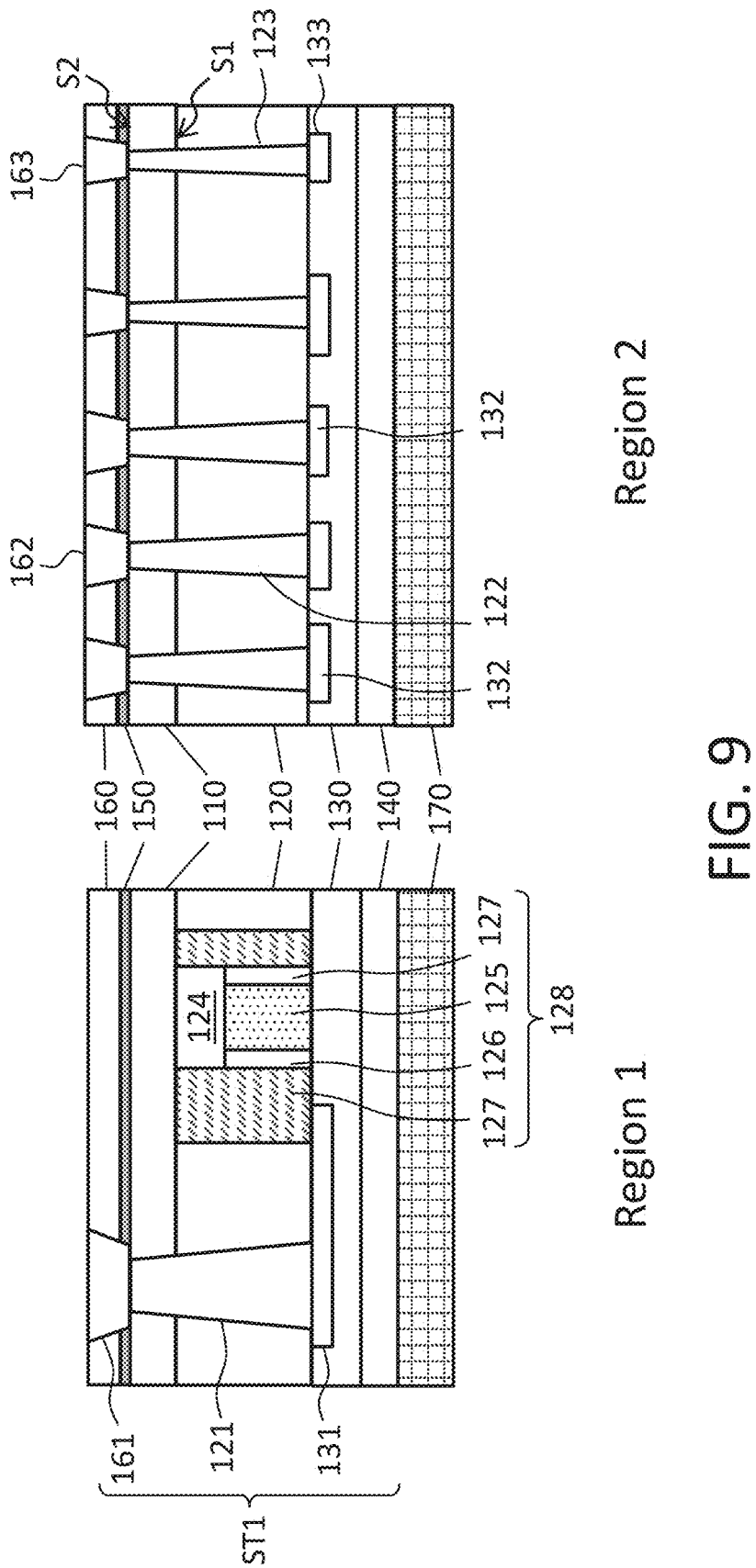

Referring to FIG. 9, a first etch stop layer 150 and a first bonding insulator 160 may be sequentially formed on the second surface S2 of the first substrate 110. First, second and third openings, each of which may extend through the first etch stop layer 150 and the first bonding insulator 160, may be formed, and first, second and third bonding pads 161, 162 and 163 may be formed in the first, second and third openings, respectively. Surfaces of the first, second and third bonding pads 161, 162 and 163 may be coplanar with a surface of the first bonding insulator 160.

The first etch stop layer 150 may include a material different from the first bonding insulator 160 to have an etch selectivity with respect to the first bonding insulator 160. In some embodiments, the first, second and third openings may be formed by a two-step etch process that includes a first step etching the first bonding insulator 160 until the first etch stop layer 150 is exposed and a second step etching the first etch stop layer 150 until the first substrate 110 is exposed. The first step is stopped once the first etch stop layer 150 is exposed.

Figure 10:
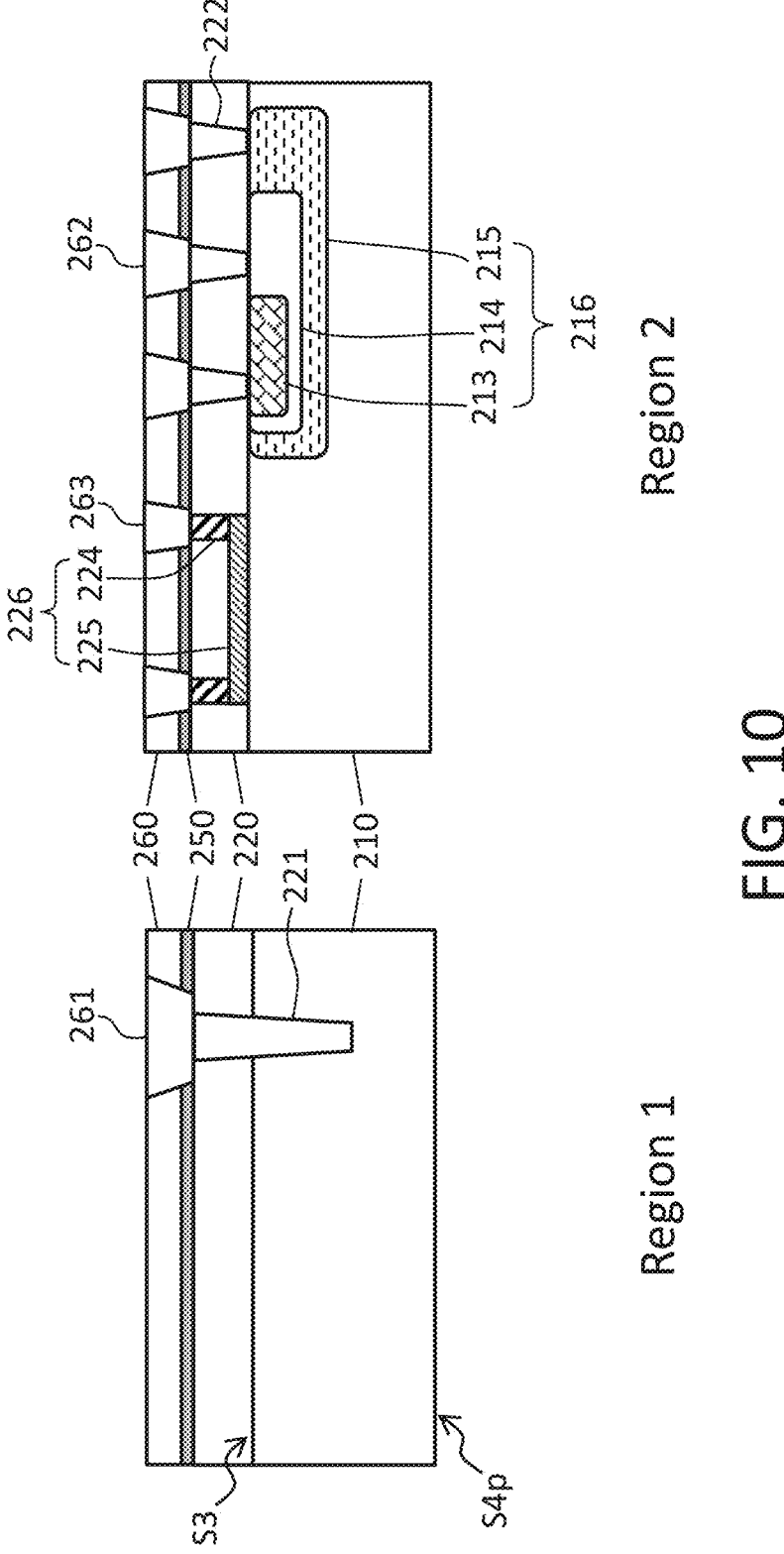

Referring to FIGS. 6 and 10 through 12, the methods may also include providing a second structure ST2 (Block 610). Referring to FIG. 10, a passive device 216 may be formed in a second substrate 210. First, second and third doped regions 213, 214 and 215 of the passive device 216 may be formed by implanting impurities into the second substrate 210. In some embodiments, those impurities may be implanted through a third surface S3 of the second substrate 210. A resistor structure 226 may be formed on the third surface S3 of the second substrate 210, and a third insulating layer 220 may be formed on the passive device 216 and the resistor structure 226. The second substrate 210 may include a preliminary fourth surface S4p opposite the third surface S3. The third surface S3 may be referred to as an upper surface or a front side, and the preliminary preliminary fourth surface S4p may be referred to as a preliminary lower surface or a preliminary back side.

Still referring to FIG. 10, a third insulating layer 220 may be formed on the third surface S3 of the second substrate 210. In some embodiments, the third insulating layer 220 may contact the third surface S3 of the second substrate 210. Fifth and sixth contact plugs 221 and 222 may be formed in the third insulating layer 220. The fifth and sixth contact plugs 221 and 222 may extend through the third insulating layer 220, and a portion of the fifth contact plug 221 may protrude into the second substrate 210. A second etch stop layer 250 and a second bonding insulator 260 may be sequentially formed on the third insulating layer 220. Fourth, fifth and sixth openings, each of which may extend through the second etch stop layer 250 and the second bonding insulator 260, may be formed, and then fourth, fifth and sixth bonding pads 261, 262 and 263 may be formed in the fourth, fifth and sixth openings, respectively. Surfaces of fourth, fifth and sixth bonding pads 261, 262 and 263 may be coplanar with a surface of the second bonding insulator 260.

The second etch stop layer 250 may include a material different from the second bonding insulator 260 to have an etch selectivity with respect to the second bonding insulator 260. In some embodiments, the fourth, fifth and sixth openings may be formed by a two-step etch process that includes a first step etching the second bonding insulator 260 until the second etch stop layer 250 is exposed and a second step etching the second etch stop layer 250 until the third insulating layer 220 is exposed. The first step is stopped once the second etch stop layer 250 is exposed.

Figure 11:
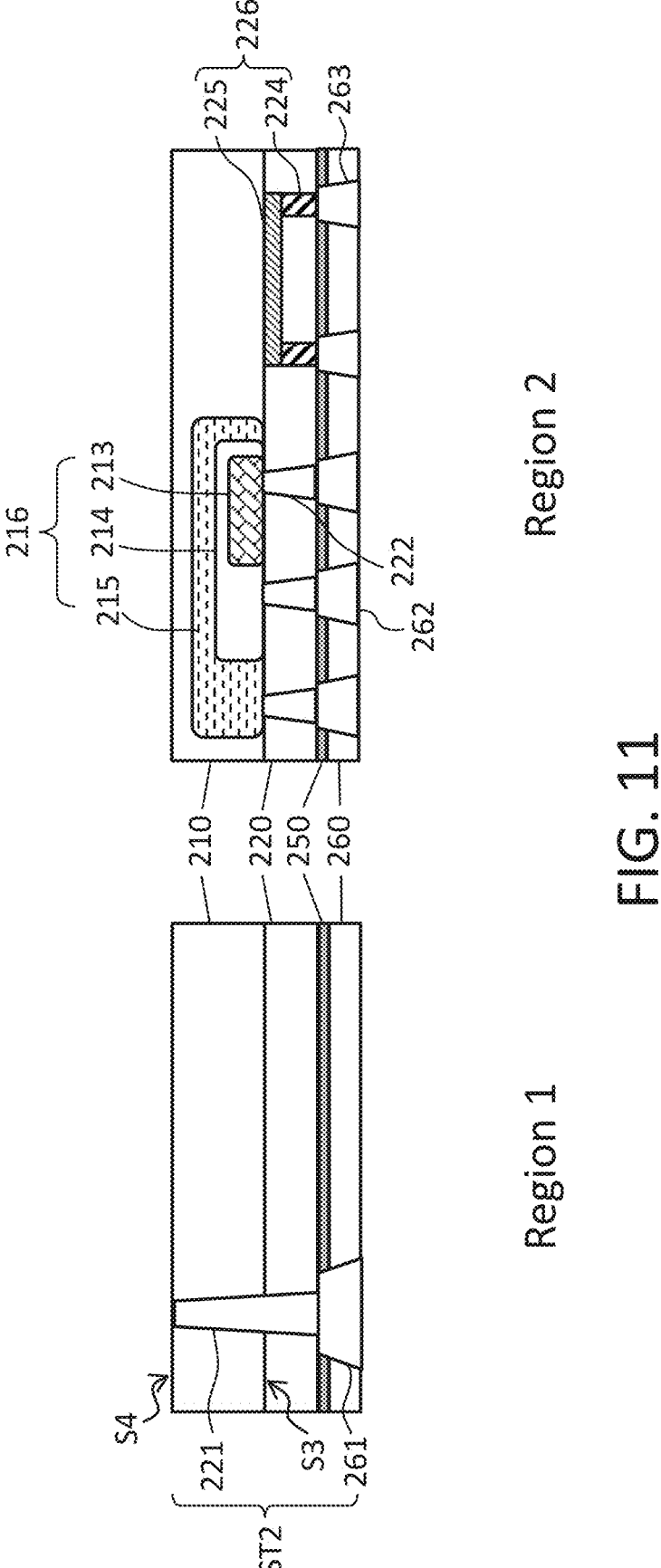

Referring to FIG. 11, the structure shown in FIG. 10 may be turned around (e.g., flipped), and a process (e.g., a grinding process, a wet etch process and/or a dry etch process) that removes a lower portion of the second substrate 210 may be performed on the preliminary fourth surface S4p until the fifth contact plug 221 is exposed. A surface of the fifth contact plug 221 may be coplanar with a fourth surface S4 of the second substrate 210 after removing the lower portion of the second substrate 210. A distance between the third surface S3 and the fourth surface S4 of the second substrate 210 (i.e., a thickness of the second substrate 210 after removing the lower portion) may be in a range of 50 nm to 100 nm. In some embodiments, the distance between the third surface S3 and the fourth surface S4 of the second substrate 210 may be longer than the distance between the first surface S1 and the second surface S2 of the first substrate 110. The fourth surface S4 may be referred to as a lower surface or a back side.

Figure 12:
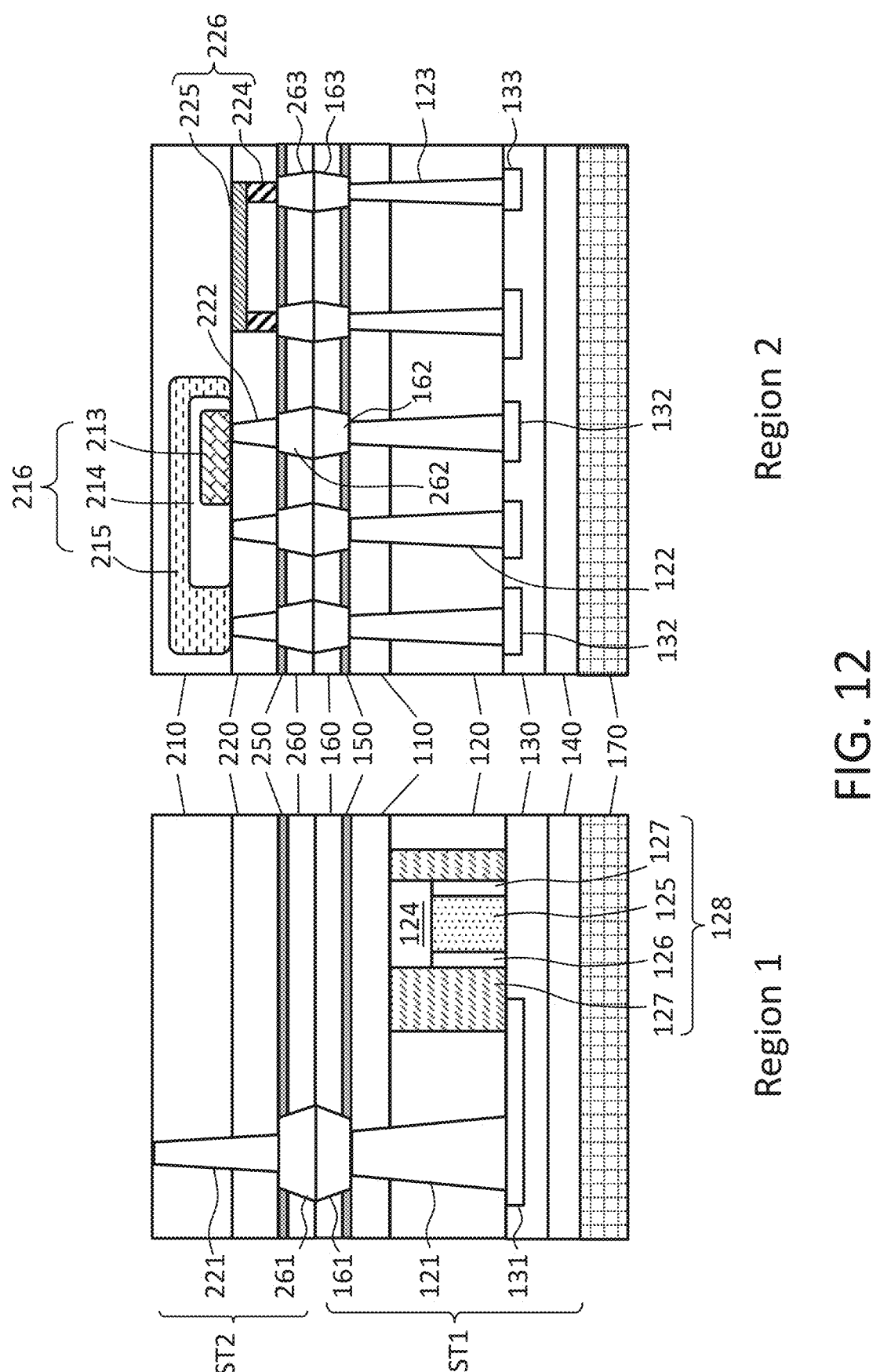

Referring to FIGS. 6 and 12, the methods may also include attaching the first structure ST1 to the second structure ST2 (Block 620) using a bonding process. The bonding process may include an annealing process. The first, second and third bonding pads 161, 162 and 163 may contact the fourth, fifth and sixth bonding pads 261, 262 and 263, respectively, and the first bonding insulator 160 may contact the second bonding insulator 260, after attaching the first structure ST1 to the second structure ST2. Although FIG. 11 illustrates that the first, second and third doped regions 213, 214 and 215 of the passive device 216 are formed before attaching the first structure ST1 to the second structure ST2, in some embodiments, at least one of the first, second and third doped regions 213, 214 and 215 may be formed after attaching the first structure ST1 to the second structure ST2 by implanting impurities into the second substrate 210 through the fourth surface S4 of the second substrate 210.

Referring FIGS. 1 and 6, the method may further include forming first and second power rails 311 and 312 on the second structure ST2 (Block 630) and forming a PDN structure 324 on the first and second power rails 311 and 312 (Block 640). For example, the first and second power rails 311 and 312 and a fourth insulating layer 310 may be formed on the second substrate 210. Further, first and second power wires 321 and 322 and a fifth insulating layer 320 may be formed on the fourth insulating layer 310. The carrier wafer 170 may be removed after the PDN structure 324 is formed.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A method of forming an integrated circuit device, the method comprising:

providing a first structure and a second structure, wherein the first structure comprises a transistor, a first bonding pad on a first side of the first structure, a first substrate extending between the transistor and the first bonding pad, and the second structure comprising a second substrate, a second bonding pad on a first side of the second structure, and a second contact plug;

forming a back-end metal structure on a second side of the first structure that is opposite the first side thereof;

forming a portion of a passive device in the second substrate;

attaching the first side of the first structure to the first side of the second structure, wherein, after attaching the first side of the first structure to the first side of the second structure, the first bonding pad contacts the second bonding pad; and then forming a power rail on a second side of the second structure that is opposite the first side thereof, wherein the second substrate extends between the first bonding pad and the power rail, and the second contact plug electrically connects the second bonding pad to the power rail.

2. The method of claim 1, wherein the first structure further comprises a first contact plug that extends through the first substrate and is electrically connected to the portion of the passive device.

3. The method of claim 1, wherein the second substrate is spaced apart from the first substrate in a first direction, wherein the integrated circuit device further comprises a first contact plug that extends through the first substrate from the first bonding pad on the first side of the first structure toward the second side of the first structure and is electrically connected to a source/drain region of the transistor, the first contact plug comprises a surface that is coplanar with a surface of the first substrate and contacts a surface of the first bonding pad, and a width of the surface of the first bonding pad in a second direction is wider than a width of the surface of the first contact plug in the second direction, and the second direction is perpendicular to the first direction.

4. The method of claim 3, wherein the second contact plug extends through the second substrate from the second bonding pad on the first side of the second structure to the power rail on the second side of the second structure and is electrically connected to the first contact plug, wherein the second contact plug comprises a surface that is coplanar with a surface of the second substrate.

5. The method of claim 1, wherein the second substrate is spaced apart from the first substrate in a first direction, wherein the integrated circuit device further comprises a first contact plug that extends through the first substrate and is electrically connected to a source/drain region of the transistor, and wherein the second contact plug extends through the second substrate and is electrically connected to the first contact plug, wherein the first bonding pad is a portion of a first merged bonding pad that contacts both the first contact plug and the second contact plug, and a width of the first merged bonding pad in a second direction increases and then decreases as a distance from the first substrate increases, and the second direction is perpendicular to the first direction.

6. The method of claim 5, wherein the integrated circuit device further comprises a first etch stop layer on the first substrate, a second etch stop layer between the first etch stop layer and the second substrate, and a bonding insulator extending between the first etch stop layer and the second etch stop layer, wherein the first merged bonding pad extends through the first etch stop layer, the bonding insulator and the second etch stop layer.

7. The method of claim 1, wherein the integrated circuit device further comprises a bonding insulator extending between the first substrate and the second substrate, and an etch stop layer extending between the bonding insulator and the second substrate, wherein the first bonding pad is a portion of a first merged bonding pad, and the second bonding pad is a portion of the first merged bonding pad, and the first merged bonding pad extends through the bonding insulator and the etch stop layer.

8. The method of claim 7, wherein the second substrate is spaced apart from the first substrate in a first direction, wherein a width of the first merged bonding pad in a second direction increases and then decreases as a distance from the first substrate increases, and the second direction is perpendicular to the first direction.

9. The method of claim 1, wherein each of the passive device and the power rail comprises a first surface facing the first substrate, and the first surface of the passive device is closer than the first surface of the power rail to the first substrate.

10. The method of claim 1, wherein forming the portion of the passive device in the second substrate is performed before attaching the first structure to the second structure.

11. The method of claim 1, wherein forming the portion of the passive device in the second substrate is performed after attaching the first structure to the second structure.

12. The method of claim 4, wherein the first and second contact plugs are aligned in the first direction.

13. The method of claim 1, wherein the second structure is stacked on the first structure in a first direction, wherein the integrated circuit device comprises a first region including the transistor and a second region including the passive device and spaced apart from the first region in a second direction.

14. The method of claim 13, wherein the transistor in the first region is free of overlap with passive devices in the first direction, and the passive device in the second region is free of overlap with transistors in the first direction.

* * * * *